United States Patent [19]

Nagahara et al.

[11] Patent Number: 6,054,249
[45] Date of Patent: Apr. 25, 2000

[54] PHOTOSENSITIVE RESIN LAMINATE, PRODUCTION METHOD THEREOF AND PACKAGE THEREOF

[75] Inventors: Shigenori Nagahara; Toshihiko Kajima, both of Ohtsu; Hiroyuki Hamada, Osaka, all of Japan

[73] Assignee: Toyo Boseki Kabushiki Kaisha, Osaka, Japan

[21] Appl. No.: 08/896,886

[22] Filed: Jul. 18, 1997

[30] Foreign Application Priority Data

Jul. 19, 1996 [JP] Japan .................................. 8-190841

[51] Int. Cl.⁷ ........................................................ G03F 7/09
[52] U.S. Cl. ........................ 430/273.1; 430/536; 430/155
[58] Field of Search .................................. 430/273.1, 536, 430/155

[56] References Cited

U.S. PATENT DOCUMENTS 5,077,175  12/1991  Fryd et al. ............................ 430/273.1
5,786,126   7/1998  Nagahara et al. ................... 430/273.1

FOREIGN PATENT DOCUMENTS 0 528 395 A1  2/1993  European Pat. Off. .

OTHER PUBLICATIONS

Derwent Publications Ltd., London, GB; Class A14, AN 95–046214 and JP 06 324 497 A (Toyobo KK), Nov. 25, 1994, abstract only.

Derwent Publications Ltd., London, GB; Class A14, AN 92–197111 and JP 04 130 325 A (Toyobo KK), May 1, 1992, abstract only.

Patent Abstracts of Japan, vol. 005, No. 001 (P–043), Jan. 8, 1981 and JP 55 133049 A (Toray Ind. Inc.), Oct. 16, 1980, abstract only.

*Primary Examiner*—Cynthia Hamilton
*Attorney, Agent, or Firm*—Morrison & Foerster LLP

[57] ABSTRACT

A photosensitive resin laminate comprising at least a support, a photosensitive resin layer, a tackiness preventive layer and a cover film successively laminated, said tackiness preventive layer having a water content of not less than 4 wt % under a relative humidity (RH) of 30–80%. During the production of such photosensitive resin laminate, a water content of the tackiness preventive layer of not less than 4% has been achieved by adding a water retention agent to the tackiness preventive layer or allowing presence of water on the cover film (preferably by directly spraying water onto the cover film or placing a water-containing sheet on the cover film), as a result of which the tackiness preventive layer thereof is free of occurrence of wrinkles during any handling step and under any environment.

7 Claims, No Drawings

PHOTOSENSITIVE RESIN LAMINATE, PRODUCTION METHOD THEREOF AND PACKAGE THEREOF

TECHNICAL FIELD OF THE INVENTION

The present invention relates to a photosensitive resin laminate comprising a tackiness preventive layer having wrinkle resistance in every handling work environment, a production method thereof and a package containing same. Said photosensitive resin laminate (hereinafter to be referred to as a photosensitive resin printing plate stock, a printing plate stock or a raw plate) is useful for preparing a finished flexographic printing plate.

BACKGROUND OF THE INVENTION

Generally, when making a finished photosensitive resin printing plate carrying images, a photosensitive resin printing plate stock cut into a required size is set on an image exposure table. Then, the uppermost cover film layer is removed, and an original drawing film, such as a negative film, is vacuum adhered to the photosensitive resin layer and exposed to an active light.

With the increasing demand for a rubber-like flexible photosensitive resin relief used in the business form printing field in recent years, the photosensitive resin printing plate stock tends to be made more flexible. In generality, a smaller hardness of the photosensitive resin printing plate stock results in greater tackiness of the surface of the photosensitive resin layer.

When the surface of the photosensitive resin layer has greater tackiness, air intrudes between the surface and the original drawing film when they are adhered to each other, so that a uniform contact between them is prevented and the image reproducibility is impaired.

In addition, when the original drawing film is removed from the photosensitive resin layer after exposure to light, the tackiness causes separation failure, thus damaging the both. A typical method to solve this problem involves formation of a thin layer (tackiness preventive layer) of a polymer that imparts less tackiness on the surface of the photosensitive resin layer. For example, Japanese Patent Unexamined Publication No. 49803/1976 (polyvinyl alcohol having a saponification degree of not less than 90%), Japanese Patent Unexamined Publication No. 110010/1977 (polyvinyl alcohol having a polymerization degree of not less than 800 and saponification degree of 70–90%), Japanese Patent Unexamined Publication No. 68224/1979 (water-soluble polymer), Japanese Patent Unexamined Publication No. 110941/1981 (soluble polyamide) are known.

When the photosensitive resin printing plate stock is used for preparing a finished flexographic printing plate, a tackiness-free coating layer (tackiness preventive layer) is highly required, since the photosensitive resin layer is more flexible and has higher tackiness. In particular, it is associated with a propensity toward occurrence of wrinkles on the tackiness preventive layer. Thus, Japanese Patent Unexamined Publication No. 208556/1982 discloses a technique wherein a releasing layer is formed on the tackiness preventive layer of a finished flexographic printing plate and US Patent No. 5077175 discloses a technique wherein a plasticizer is added to polyvinyl alcohol for the prevention of wrinkles when forming a tackiness preventive layer. The present inventors have filed a patent application drawn to a tackiness preventive layer composition for flexographic printing, which comprises polyvinyl alcohol and glycerin in a proportion of not less than 4 wt % to less than 8 wt % of the entire composition (Japanese Patent Unexamined Publication No. 130325/1992). Also, they have filed a patent application drawn to a tackiness preventive layer and a composition thereof for a photosensitive resin printing plate stock, which contains polyvinyl alcohol and a crystallizing agent soluble in water and having a boiling point of 120° C.–240° C. (Japanese Patent Unexamined Publication No. 324497/1994).

However, formation of a releasing layer as disclosed in Japanese Patent Unexamined Publication No. 208556/1982 not only increases production steps but also tends to produce coating defect due to the application of a tackiness-free coating layer on the releasing layer, thus requiring high coating technique. The polyvinyl alcohol containing a plasticizer disclosed in U.S. Pat. No. 5,077,175 contains a low molecular weight polyethylene glycol in a proportion of at least 8% of the entire weight of the composition. However, this mixture is susceptible to influence of external factors such as humidity, and the tackiness preventive layer comes to have tackiness under high humidity, which is due to moisture absorption, to impair the original object of non-tackiness.

Japanese Patent Unexamined Publication No. 130325/1992 is drawn to a composition having a certain glycerin content, and somewhat effective for preventing wrinkles of a tackiness preventive layer, but the effect thereof is degraded when the handling work environment changes. In addition, mist (dew condensation) of glycerin is developed during production, since glycerin has a low molecular weight, thus polluting production apparatuses. What is more, glycerin is said to be harmful to human. When coating temperature etc. change, moreover, a glycerin content also varies, which in turn results in difficulty in producing products having a constant quality, thus posing various problems in terms of production and quality.

On the other hand, Japanese Patent Unexamined Publication No. 324497/1994 has resolved the above-mentioned problems encountered during production, whereas could not entirely prevent wrinkles of the tackiness preventive layer. In other words, wrinkles were sometimes observed when, for example, a photosensitive resin printing plate stock was handled roughly, plate making environment changed or the photosensitive resin layer became more flexible.

As mentioned earlier, none of the prior art techniques is suitable for the tackiness preventive layer of flexible photosensitive resin printing plate stocks. In particular, the problem of wrinkles should be solved to meet the requirements of quality. For example, when separation of a cover film is stopped and then resumed, linear, stripe wrinkles are developed at the site where the separation was stopped, so that the cover film is generally required to be separated at once without interruption. Yet, it is extremely difficult to completely prevent stripe wrinkles, since the separation may be stopped due to an incorrect operation for separation and the like.

In other cases, greater sizes of the photosensitive resin printing plate stock could lead to rough handling of the stock due to increased difficulty in handling, in which case the photosensitive resin printing plate stock may be deformed. When the deformed photosensitive resin printing plate stock is set on a normal, flat image exposure table, and the cover film is peeled off, the tackiness preventive layer on the photosensitive resin layer could have developed wrinkles. Moreover, when the photosensitive resin printing plate stock is deformed into a shape having irregularities and then returned to the original plate shape, the tackiness preventive layer thereof should have produced many wrinkles which do not disappear by simply leaving the plate stock.

When a printing plate (relief) prepared using a photosensitive resin printing plate stock having wrinkles in the tackiness preventive layer is used for printing, the resulting printed matter shows defective parts due to the wrinkles, whereby the quality of the printed matter is degraded and the product value is lost. As such, the photosensitive resin printing plate stock requires sufficient caution in handling and transport thereof, though in fact the realization thereof is difficult in actual handling.

Moreover, a photosensitive resin printing plate stock cannot be stored or made into a printing plate under a certain constant environment throughout a year, and therefore, it is required to be able to retain certain quality even when the environment has changed. In the case of a tackiness preventive layer mainly composed of a water-soluble polymer, in particular, its water content tends to vary due to environmental differences, which is construed as producing wrinkles and degrading the quality thereof.

It is therefore an object of the present invention to solve the above-mentioned various defects of the conventional techniques, whereby to avoid occurrence of wrinkles in the tackiness preventive layer of the photosensitive resin printing plate stock during any handling or under any environment.

DETAILED DESCRIPTION OF THE INVENTION

Accordingly, the present invention provides the following.

(1) A photosensitive resin laminate comprising at least a support, a photosensitive resin layer, a tackiness preventive layer and a cover film successively laminated, said tackiness preventive layer having a water content of not less than 4 wt % under a relative humidity (RH) of 30–80%.

(2) The photosensitive resin laminate of the above (1), wherein the tackiness preventive layer has a water content of 4–12 wt % under a relative humidity (RH) of 30–80%.

(3) The photosensitive resin laminate of the above (1), wherein the tackiness preventive layer contains a water retention agent.

(4) The photosensitive resin laminate of the above (1), wherein the tackiness preventive layer contains a water-soluble polymer, a water retention agent and a crystallizing agent.

(5) A method for producing a photosensitive resin laminate comprising at least a support, a photosensitive resin layer, a tackiness preventive layer and a cover film successively laminated, said tackiness preventive layer retaining a water content of not less than 4 wt % under a relative humidity (RH) of 30–80% by the action of water present on the cover film.

(6) The production method of the above (5), further comprising a water-containing sheet on the cover film.

(7) A package comprising superimposed plural photosensitive resin laminates, each laminate comprising at least a support, a photosensitive resin layer, a tackiness preventive layer and a cover film successively laminated, and a water-containing sheet placed on each cover film.

The present invention is described in detail in the following.

The photosensitive resin laminate of the present invention comprises at least a support, a photosensitive resin layer, a tackiness preventive layer and a cover film, which are laminated successively.

The tackiness preventive layer needs to be removed during developing after exposure to light, so that it is mainly composed of a water-soluble polymer. The water-soluble polymer to be used in the present invention is exemplified by polyvinyl alcohol having a saponification degree of at least 60%; modified polyvinyl alcohols such as carboxyl-modified polyvinyl alcohol and silane-modified polyvinyl alcohol; polyvinyl ethers such as polyvinyl methyl ether, polyvinyl ethyl ether and polyvinyl isobutyl ether; polyvinylpyrrolidone; cellulose derivatives such as methylcellulose, hydroxyethylcellulose, hydroxypropylcellulose, hydroxypropylmethylcellulose and carboxymethylcellulose; water-soluble polymers and aqueous soluble polymer such as poly(sodium alginate), poly (sodium acrylate), aqueous silicone-acryl graft polymer, polyethyleneoxide, water-soluble or water dispersible polyesters, water-soluble polyurethane and ethylcellulose; and water swellable polymers such as ethylene-vinyl alcohol copolymer, which are optionally used. Of these, polyvinyl alcohol and modified polyvinyl alcohol having a polymerization degree of 500–4000, preferably 1000–3000, and saponification degree of not less than 70%, preferably 80–99%, are preferable for tackiness preventive layer, in terms of oxygen barrier property, film formability, resistance to heat and humidity, coatability and the like.

This tackiness preventive layer preferably contains a water retention agent. In the present invention, the water retention agent is soluble in water and the water retention characteristics are free from influence exerted by variation in environmental conditions, such as temperature and humidity, and can be sustained for a long time. The water retention characteristics preferably show the smallest possible dependency on environmental difference in humidity between low humidity and high humidity. In the present invention, water retention characteristics of the water retention agent is expressed as a water content, which is adequately determined in combination with the amount thereof added to the tackiness preventive layer. For example, when a water retention agent having a water content of not less than 70% is used, the amount thereof to be used should be reduced. Otherwise, the tackiness of the tackiness preventive layer may increase, or changes greatly in response to environmental variations. The water content of the water retention agent is preferably 4–50 wt %, particularly 5–20 wt %, under relative humidity of 30–80%. In the present invention, the water content of the water retention agent is a percentage of the weight of water contained in the water retention agent relative to the entire weight of the water retention agent containing water.

In consideration of the compatibility with the water-soluble polymer, the solubility parameter of the water retention agent is preferably similar to the solubility parameter (12–14) of the water-soluble polymer or greater than that.

The water retention agent to be used in the present invention includes organic compounds mainly comprising polyols and modified compounds thereof, organic metal compounds, phospholipids and sphingolipids. Specifically, hyaluronic acid, collagen, cholesterol ester, elastin, glycerose, diethylene glycol, propione glycol, triethylene glycol, maltitol, 1,2,6-hexane triol, dipropylene glycol, hexylene glycol, 2-ethylene-1,3-hexanediol, sodium hyaluronate, polyethylene sorbitol are exemplified. In addition, sodium lactate, amino acid, sodium pyrrolidoncarboxylate and the like can be used. Of these water retention agents, polyethylene sorbitol, maltitol and the like are preferable from various aspects such as water retention characteristics, stability with the passage of time, compatibility, coatability (leveling performance), wrinkle resistance and the like.

The amount of the water retention agent in the tackiness preventive layer is appropriately determined in combination with the water content of the water retention agent to be used. It is preferably 10–70 wt %, more preferably 20–60 wt %, of the water-soluble polymer. When the amount of the water retention agent is too small, the water content of the tackiness preventive layer may not satisfy the level of not less than 4 wt %, whereas when it is too much, the tackiness preventive layer may acquire tackiness and the water retention agent may bleed out from the tackiness preventive layer.

Thus, by adding a water retention agent to the tackiness preventive layer, the water content of the tackiness preventive layer can be retained at not less than 4 wt % under any relative humidity within the range of 30–80%.

This tackiness preventive layer preferably contains a crystallizing agent. The crystallizing agent crystallizes part of the water-soluble polymer having a low crystallizability, whereby variations in the characteristics of the water-soluble polymer, which are caused by the addition of a water retention agent, are suppressed to maintain the balance between crystallizability and non-crystallizability.

The crystallizing agent to be used in the present invention is soluble in water, is selected from the group of low molecular weight alcohols, ethers, ketones, esters, carboxylic acids, amines, amides and the like, and may also contain an atom such as iodine, halogen and phosphorus. Being soluble-in water means that it shows solubility of not less than 1 wt % in water at 20° C., with preference given to a solubility of not less than 5 wt %. Specific examples include monovalent alcohols such as cyclohexanol, benzyl alcohol, 2-ethyl butyl alcohol and isoamyl alcohol; polyhydric alcohols such as ethylene glycol, 1,2-propylene glycol, 1,3-propylene glycol, hexylene glycol, 1,2-butylene glycol, 1,3-butylene glycol, glycerin, trimethylolpropane and sorbitol and monoalkyl ethers thereof; nitrogen-containing compounds such as dimethylacetamide, monoethanolamine, diethanolamine, ethyldiethanolamine, triethanolamine, N-methylpyrrolidone, cyclohexylamine, aniline, urea and picoline; organic acids and esters thereof such as butyric acid, ethyl lactate and triethyl phosphate; aldehydes and ketones such as furfural, acetylacetone, diacetone alcohol and cyclohexanone; acetals; ketones; and sulfur-containing compounds such as dimethyl sulfoxide.

Of these crystallizing agents, an organic compound having a boiling point of 120° C.–240° C. is preferable for successful prevention of mist and stability with the passage of time. In addition, an organic compound having a vapor pressure at 105° C. of not less than 5 Torr is preferable. The vapor pressure at 105° C. is 30 Torr for 1,2-propylene glycol, 16 Torr for 1,3-propylene glycol, 20 Torr for ethylene glycol, 5.8 Torr for 1,4-butanediol, 16 Torr for 1,3-butanediol, 60 Torr for dimethyl acetamide and 120 Torr for dimethyl sulfoxide.

Of these crystallizing agents, moreover, the particularly preferred are 1,2-propylene glycol, 1,3-propylene glycol, 1,3-butanediol and 1,4-butanediol in consideration of various aspects such as coatability (leveling performance), stability with the passage of time, wrinkle resistance and the like.

These crystallizing agents are preferably contained in the tackiness preventive layer in a proportion of 0.5–10 wt %, more preferably 1–6 wt %, relative to the water-soluble polymer. When the amount of the crystallizing agent is too small, an increased proportion of noncrytalline part makes it susceptible to temperature, and when it is too much, higher crystallizability may prevent control of water absorption.

The photosensitive resin laminate of the present invention can be prepared, for example, by the following method. That is, a tackiness preventive composition is applied to a cover film in advance, and dried to form a tackiness preventive layer. An adhesive layer is formed on a support in advance. A photosensitive resin composition is interposed between the above-mentioned cover film, with the tackiness preventive layer being set to face inside and a support with the adhesive layer being set to face inside, and applied to thermal press, cast forming, calendar processing, coating and the like to give a laminate having a desired thickness and width.

A coating solution of the tackiness preventive composition to be applied to a cover film is a 1–15 wt %, preferably 2–5 wt %, aqueous solution of water-soluble polymer (e.g., polyvinyl alcohol) prepared by adding 30–200 wt %, particularly 50–180 wt %, of crystallizing agent and 10–70 wt %, particularly 20–60 wt %, of water retention agent per net weight of water-soluble polymer. When a water retention agent is added to said composition and the mixture is applied and dried to form a tackiness preventive layer, the water content of the tackiness preventive layer can be always retained at not less than 4 wt % under any relative humidity falling within the range of 30–80% by the action of the water retention agent contained therein. Note that part of the crystallizing agent may evaporate during the above-mentioned drying step, though depending on the vapor pressure at the drying temperature of the crystallizing agent.

In addition, this composition may contain various surfactants, defoaming agents, leveling agents, penetrating agents and the like to improve coatability on a cover film, as well as preservatives for stabilizing aqueous solution when left standing. As the solvent, preferred is water. The thickness of the tackiness preventive layer after drying is 0.1–10 μm, preferably 2–5 μm.

The cover film to be used in the present invention is most preferably a polyethylene terephthalate film from the aspect of dimensional stability, heat resistance and mechanical performance. A material, such as polyethylene, polypropylene, polystyrene and the like, which can be easily released from a tackiness preventive layer, can be used as a single film or laminate-coated film. The surface of the cover film may be smooth, with preference given to a mat having a surface roughness of not more than 5 μm.

In the present invention, the photosensitive resin composition forming the photosensitive resin layer may be any as long as it permits development using water or an aqueous medium. For example, the photosensitive resin composition described in Japanese Patent Unexamined Publication Nos. 211451/1985, 173055/1985, 8648/1988, 175702/1990, 108542/1989, 3162/1992, 219735/1989, 31192/1989, 305805/1990 and 228060/1991 can be used.

Examples of the support to be used in the present invention include metallic plates of iron, stainless, aluminum and the like, plastic films of polyester, polyamide, polyimide, polypropylene and the like, and plates made from an elastomer such as natural rubber, synthetic rubber, soft vinyl chloride and the like, with preference given to a polyester film, particularly a polyethylene terephthalate film.

The tackiness preventive layer of the photosensitive resin laminate of the present invention has a water content of not less than 4 wt %, preferably 4 wt %–12 wt %. The water content of the tackiness preventive layer of the present invention refers to the weight of water contained in the tackiness preventive layer relative to the entire weight of the tackiness preventive layer containing water. When the tackiness preventive layer has a water content of less than 4 wt%, it tends to be influenced by environmental changes, and sufficient wrinkle resistance cannot be achieved during handling or under certain plate processing environment. Conversely, however, when it exceeds 12 wt%, it can possibly become sticky under high humidity to the degree that the adhesion of original drawing film is impaired or difficulty such as blocking is encountered, despite its effectiveness in preventing wrinkles.

In the present invention, the water content of the tackiness preventive layer was determined by the following method. First, a photosensitive resin laminate was exposed to mercury light for 3 minutes from the top surface of the cover film, and the cover film was peeled off. Then, the tackiness preventive layer was recovered as a sample. The determination environment was measured at the same time, and the water content was automatically measured using the following measurement devices.

measurement device moisture vaporization apparatus
(EV-6, manufactured by Hiranuma Industry)
$N_2$, 0.3 l/min
120° C.×1 min retention
moisture automatic measurement apparatus (AQV-1, manufactured by Hiranuma Industry)
potency of KF reagent 4.696 mg/ml
weight of reagent 60–90 mg A method other than the above-mentioned method, which relies on addition of a water retention agent to the above-mentioned tackiness preventive layer, is described in the following, which aims at retaining the water content of the tackiness preventive layer of the photosensitive resin laminate of the present invention at not less than 4 wt %.

That is, a photosensitive resin laminate, wherein at least a photosensitive resin layer, a tackiness preventive layer and a cover film are successively laminated on a support, is prepared and water is made to be present on the surface of the cover film. Specific means therefor includes spraying water directly on the surface of the cover film. When to spray water may be before packing superimposed plural photosensitive resin laminates, or after taking them out from the package but before use as printing plate stocks. In the latter case, after spraying water, the laminates are stood for a sufficient time, and exposed and developed.

Alternatively, a water-containing sheet may be set on the cover film. As used herein, the water-containing sheet may be any as long as it contains water and is free of particular limitation on material and thickness. Preferred are porous sheet and foamed sheet made from natural material or synthetic resin; and various papers such as newspaper, rough paper and woodfree paper, all of which containing 0.1–2 g of water per $m^2$ thereof. For example, water is sprayed onto various papers (particularly preferred is woodfree paper), and the obtained water-containing sheet is set on the cover film. When to place the water-containing sheet is not limited. It may be placed on the cover film before packing superimposed plural photosensitive resin laminates, or after taking them out from the package but before use as printing plate stocks. In the latter case, after placing the water-containing sheet on the cover film, the laminates are stood for a sufficient time, and exposed and developed.

The presence of water on the surface of the cover film is considered to be conducive to higher water content as a result of invasion of water from the side of the tackiness preventive layer.

The photosensitive resin laminate of the present invention is generally packaged in plurality and stored, and opened when in use. Though subject to variation in number depending on the thickness of the photosensitive resin laminate, 5–30 sheets, preferably 10–20 sheets, of photosensitive resin laminate are housed in one package, each photosensitive resin laminate including water-containing sheet disposed on the cover film. A cushioning sheet may be further disposed on the water-containing sheet or the water-containing sheet may also function as a cushioning sheet. The cushioning sheet may be disposed as the outermost layer and the lowermost layer alone of the photosensitive resin laminates superimposed in plurality.

The plural photosensitive resin laminates including a water-containing sheet placed on each cover film are packaged by a conventional method, and, wrapped with, for example, a plastic sheet of polyethylene, polypropylene, polyvinyl chloride, polystyrene, polyester, nylon or polycarbonate one by one or by plural laminates, which are packed in a cardboard box, a wooden packaging box, a metallic packaging box, and the like.

The photosensitive resin laminate of the present invention, wherein at least a support, a photosensitive resin layer, a tackiness preventive layer and a cover film are successively laminated, has achieved a water content of the tackiness preventive layer of not less than 4% by ① adding a water retention agent (preferably polyethylene sorbitol) to the tackiness preventive layer or ② allowing presence of water on the cover film (preferably by directly spraying water onto the cover film or placing a water-containing sheet on the cover film), as a result of which the tackiness preventive layer thereof is free of occurrence of wrinkles during any handling step and under any environment. Using such photosensitive resin laminate as a printing plate stock, the images of the original drawing film can be faithfully reproduced, so that a printed matter having superior quality can be produced. Such photosensitive resin laminate can be widely used for preparing a finished flexographic printing plate, a photosensitive resin relief, a finished intaglio printing plate, a finished lithography printing plate, a finished screen printing plate and the like.

The present invention is described in more detail by way of Examples, which should not be construed as limiting the invention. In the Examples, "part" means "part by weight" unless otherwise specified.

EXAMPLE 1

[Preparation of tackiness preventive layer]

To pure water (944 parts) was added GOHSENOL AH-26 (polyvinyl alcohol, manufactured by The Nippon Synthetic Chemical Industry Co., Ltd., saponification degree 97–98%, 25.5 parts) and the mixture was stirred at 90° C. for 1 hour. Then, the mixture was cooled to room temperature. To this aqueous solution were added 1,2-propylene glycol (25 parts) and SE-270 (7 parts, manufactured by SANYO CHEMICAL INDUSTRIES, LTD., pure polyethylene sorbitol 85%) and EPAN 740 (0.06 parts, manufactured by DAI-ICHI KOGYO SEIYAKU CO., LTD.) with gentle stirring, and the mixture was stirred for 30 minutes. This solution was coated on a chemical mat film (100 μm, manufactured by TOYO CLOTH TC-5002) at a rate of 6 m per minute with a reverse roll, followed by drying in a dryer at 105° C.×3 minutes at a blow rate of 0.5 m/min. The tackiness preventive layer thus obtained had a thickness of 2.1 μm.

[Preparation of photosensitive resin composition]

A photosensitive resin composition was prepared by the following method. A solution of hexamethylene diisocyanate (21.8 parts), dimethylolpropionic acid (15.4 parts), polytetramethylene glycol (PG-100, manufactured by NIPPON POLYURETHANE INDUSTRY CO., LTD., 7.6 parts) and di-n-butyltin dilaurate (1.0 part) in tetrahydrofuran (300 parts) was placed in a 1 l flask equipped with a stirrer and heated to 65° C. to allow reaction for 3 hours with stirring. A solution of terminal amino-containing acrylonitrile·butadiene oligomer (Hycar ATBNX 1300×16, manufactured by Ube Industries, Ltd., 55.3 parts) in methyl ethyl ketone (100 parts) prepared in a different container was added in the above-mentioned flask with stirring at room temperature. Tetrahydrofuran and methyl ethyl ketone were removed from the obtained polymer solution under reduced pressure to give a polymer having a number average molecular weight of 21000. Then, to a solution of said polymer (100 parts) in methyl ethyl ketone (100 parts) was added lithium hydroxide (4.8 parts) in methyl alcohol (100 parts) with stirring at room temperature, and the mixture was stirred for 30 minutes to give hydrophilic polymer [I].

The above-mentioned hydrophilic polymer [I] (10 parts), chlorinated polyethylene (H-135, manufactured by DAISO CO., LTD., 45 parts) as a hydrophobic polymer, styrene·butadiene rubber (JSR1507, manufactured by Japan Synthetic Rubber Co., Ltd., 15 parts), butadiene oligoacrylate (PB-A, manufactured by Kyoeisha Chemical Co., Ltd., 28.5 parts), benzil dimethyl ketal (IRGACURE 651, manufactured by Ciba-Geigy Ltd., 1 part) and hydroquinone monomethyl ether (0.5 part) were dissolved or dispersed in a mixture of toluene (40 parts) and water (10 parts), kneaded in a heat-kneader at 105° C. for dissolution, and defoamed to give a photosensitive resin composition.

[Preparation of photosensitive resin laminate]

The photosensitive resin composition obtained above was interposed between a 125 μm thick polyester film having an adhesive layer formed in advance and a chemical mat film having a tackiness preventive layer obtained above, and heat-pressed using a heat pressing machine at 100° C. and under a pressure of 150 kg/cm² for 30 seconds such that the tackiness preventive layer and the adhesive layer were in contact with a photosensitive resin to give a 2.8 mm thick photosensitive resin laminate (printing plate stock).

[Evaluation of printing plate stock]

The obtained printing plate stock was visually evaluated as to the following evaluation items under conditions of 24° C./33% RH, 26° C./42% RH, 28° C./56% RH and 23° C./71% RH. First, a mat film which was the uppermost layer of the printing plate stock was peeled off to leave the tackiness preventive layer on the photosensitive resin layer, and the surface thereof was observed. As a result, it showed smooth, mirror-like surface under every condition, and was free of wrinkles. Then, the plate without the mat film was deformed to have irregularities and then observed on a flat table to find no wrinkles under every condition. After bending the printing plate stock, the mat film was peeled off and the surface of the tackiness preventive layer was observed to find no wrinkles under every condition.

The printing plate stock without the mat film was subjected to measurement of the water content of the tackiness preventive layer according to the above-mentioned measurement method of the water content. As a result, the water content was 4.49–8.86 wt %.

Then, a negative film having images was adhered onto this printing plate stock and exposed to a mercury light (manufactured by DAINIPPON SCREEN MFG. CO., LTD.) at illuminance of 25 W/m² for 5 minutes. The negative film was easily peeled off. After removing the negative film, it was developed in neutral water containing 2 wt % sodium alkylnaphthalenesulfonate at 40° C. for 15 minutes with a brush to form a relief having a linear pattern of 0.8 mm depth. This image pattern faithfully reflected the image on the negative film used. The obtained relief showed good receipt and transfer of the ink, thus forming clear images.

Comparative Example 1

In the same manner as in Example 1, except that SE-270 was not used as the component of the tackiness preventive layer, a cover film comprising a tackiness preventive layer (thickness 1.9 μM) was prepared. Using same, the printing plate stock was prepared in the same manner as in Example 1.

The obtained printing plate stock was subjected to the same evaluation under the same conditions as in Example 1. First, a mat film which was the uppermost layer of the printing plate stock was peeled off to leave the tackiness preventive layer on the photosensitive resin layer, and the surface thereof was observed. As a result, it showed a number of human skin-like wrinkles on the surface under the condition of 24° C./33% RH. The water content of the tackiness preventive layer then was 2.76 wt %. Then, the plate without the mat film was deformed to produce irregularities and observed on a flat table, as a result of which wrinkles were found under the conditions of 24° C./33% RH, 26° C./42% RH and 28° C./56% RH, and the wrinkles were not removed even after leaving the plate on a flat table.

The printing plate stock was bent and the mat film was peeled off. The surface of the tackiness preventive layer was observed to find wrinkles under the condition of 24° C./33% RH, 26° C./42% RH and 28° C./56% RH.

In the same manner as in Example 1, the plate was exposed to light. The surface of the images cured by light had wrinkles and the printed matter showed transfer mark of the ink.

EXAMPLE 2

To pure water (942 parts) was added GOHSENOL AH-26 (25.0 parts) and an aqueous solution was prepared in the same manner as in Example 1. To this aqueous solution were added 1,2-propylene glycol (25 parts), SE-270 (9.4 parts) and EPAN 740 (0.06 part). This solution underwent similar steps as in Example 1 to form a tackiness preventive layer on the cover film. The tackiness preventive layer thus obtained had a thickness of 2.2 μm. Using this cover film with a tackiness preventive layer formed thereon, a printing plate stock was prepared in the same manner as in Example 1.

The obtained printing plate stock was subjected to the same evaluation under the same conditions as in Example 1. First, a mat film which was the uppermost layer of the printing plate stock was peeled off to leave the tackiness preventive layer on the photosensitive resin layer, and the surface thereof was observed. As a result, it showed smooth, mirror-like surface under every condition, and was free of wrinkles. The water content of the tackiness preventive layer was 4.5–8.91 wt %. Then, the plate without the mat film was deformed to produce irregularities and observed on a flat table to find no wrinkles under every condition. After bending the printing plate stock, the mat film was peeled off and the surface of the tackiness preventive layer was observed to find no wrinkles under every condition.

In the same manner as in Example 1, the plate was exposed to light. As a result, the printed matter had a fine quality.

EXAMPLE 3

In the same manner as in Example 1, except that SE-270 was used in an amount of 11.2 parts as the component of the tackiness preventive layer, a cover film comprising a tackiness preventive layer was prepared. Using same, the printing plate stock was prepared in the same manner as in Example 1.

The obtained printing plate stock was subjected to the same evaluation under the same conditions as in Example 1. First, a mat film which was the uppermost layer of the printing plate stock was peeled off to leave the tackiness preventive layer on the photosensitive resin layer, and the surface thereof was observed. As a result, it showed smooth, mirror-like surface under every condition, and was free of wrinkles. The water content of the tackiness preventive layer was 4.65–9.47 wt %. Then, the plate without the mat film was deformed to produce irregularities and observed on a flat table to find no wrinkles under every condition. After bending the printing plate stock, the mat film was peeled off and the surface of the tackiness preventive layer was observed to find no wrinkles under every condition.

In the same manner as in Example 1, the plate was exposed to light. As a result, the printed matter had a fine quality.

Comparative Example 2

In the same manner as in Example 3, except that 1,2-propylene glycol and SE-270 were not used as the component of the tackiness preventive layer, a cover film comprising a tackiness preventive layer was prepared. Using same, the printing plate stock was prepared in the same manner as in Example 3.

The obtained printing plate stock was subjected to the same evaluation under the same conditions as in Example 1. First, a mat film which was the uppermost layer of the printing plate stock was peeled off to leave the tackiness preventive layer on the photosensitive resin layer, and the surface thereof was observed. As a result, it produced wrinkles on the surface under every condition. The water content of the tackiness preventive layer then was 1.47–3.88 wt %. Then, the plate without the mat film was deformed to produce irregularities and observed on a flat table, as a result of which wrinkles were found under every condition, and the wrinkles were not removed even after leaving the plate on a flat table. After bending the printing plate stock, the mat film was peeled off and the surface of the tackiness preventive layer was observed to find wrinkles under every condition. The printing step as in Example 1 was not undertaken.

EXAMPLE 4

In the same manner as in Example 1, except that SE-270 was used in an amount of 16.3 parts as the component of the tackiness preventive layer, a cover film comprising a tackiness preventive layer was prepared. Using same, the printing plate stock was prepared in the same manner as in Example 1.

The obtained printing plate stock was subjected to the same evaluation under the same conditions as in Example 1. First, a mat film which was the uppermost layer of the printing plate stock was peeled off to leave the tackiness preventive layer on the photosensitive resin layer, and the surface thereof was observed. As a result, it showed smooth, mirror-like surface under every condition, and was free of wrinkles. The water content of the tackiness preventive layer was 5.19–10.63 wt %. Then, the plate without the mat film was deformed to produce irregularities and observed on a flat table to find no wrinkles under every condition. After bending the printing plate stock, the mat film was peeled off and the surface of the tackiness preventive layer was observed to find no wrinkles under every condition.

In the same manner as in Example 1, the plate was exposed to light. As a result, the printed matter had a fine quality.

EXAMPLE 5

In the same manner as in Example 3, except that ethylene glycol was used instead of 1,2-propylene glycol as the component of the tackiness preventive layer, a cover film comprising a tackiness preventive layer was prepared. Using same, the printing plate stock was prepared in the same manner as in Example 3.

The obtained printing plate stock was subjected to the same evaluation under the same conditions as in Example 1. First, a mat film which was the uppermost layer of the printing plate stock was peeled off to leave the tackiness preventive layer on the photosensitive resin layer, and the surface thereof was observed. As a result, it showed smooth, mirror-like surface under every condition, and was free of wrinkles. The water content of the tackiness preventive layer was 5.32–9.78 wt %. Then, the plate without the mat film was deformed to produce irregularities and observed on a flat table to find no wrinkles under every condition. After bending the printing plate stock, the mat film was peeled off and the surface of the tackiness preventive layer was observed to find no wrinkles under every condition.

In the same manner as in Example 1, the plate was exposed to light. As a result, the printed matter had a fine quality.

Comparative Example 3

In the same manner as in Example 1, except that glycerin (6 parts, 0.6 wt% of coating solution for the tackiness preventive layer) was used instead of SE-270 as the component of tackiness preventive layer, a cover film comprising a tackiness preventive layer was prepared. Using same, the printing plate stock was prepared in the same manner as in Example 1.

The obtained printing plate stock was subjected to the same evaluation under the same conditions as in Example 1. First, a mat film which was the uppermost layer of the printing plate stock was peeled off to leave the tackiness preventive layer on the photosensitive resin layer, and the surface thereof was observed. As a result, it showed human skin-like wrinkles dispersed on the surface under the condition of 24° C.·33% RH. The water content of the tackiness preventive layer then was 3.5 wt %. Then, the plate without the mat film was deformed to produce irregularities and observed on a flat table, as a result of which wrinkles were found under the conditions of 24° C.·33% RH and the wrinkles were not removed even after leaving the plate on a flat table. After bending the printing plate stock, the mat film was peeled off and the surface of the tackiness preventive layer was observed to find wrinkles under the conditions of 24° C.·33% RH.

In the same manner as in Example 1 the plate was exposed to light.

As a result, the surface of the image cured with light had wrinkles, and the printed matter showed transfer mark of the ink.

Comparative Example 4

In the same manner as in Example 1, except that 110 parts of a low molecular weight polyethylene glycol (molecular weight 1000, 10.0 wt % in a coating solution for tackiness preventive layer) was used instead of SE-270 as the component of the tackiness preventive layer, a cover film comprising a tackiness preventive layer was prepared. Using same, the printing plate stock was prepared in the same manner as in Example 1.

The obtained printing plate stock was subjected to the same evaluation under the same conditions as in Example 1. First, a mat film which was the uppermost layer of the printing plate stock was peeled off to leave the tackiness preventive layer on the photosensitive resin layer, and the surface thereof was observed. As a result, it showed crater-like wrinkles on the surface under the condition of 24° C.·33% RH. The water content of the tackiness preventive layer then was 1.7 wt %. Then, the plate without the mat film was deformed to produce irregularities and observed on a flat table, as a result of which wrinkles were found under the conditions of 24° C.·33% RH and 26° C.·42% RH, and the wrinkles were not removed even after leaving the plate on a flat table. After bending the printing plate stock, the mat film was peeled off and the surface of the tackiness preventive layer was observed to find wrinkles under the conditions of 24° C.·33% RH and 26° C.·42% RH.

The results of Examples 1–5 and Comparative Examples 1–4 are shown in Table 1.

EXAMPLE 6

The photosensitive resin composition obtained in Example 1 was interposed between a 125 $\mu$m thick polyester film and a chemical mat film having a tackiness preventive layer as obtained in Comparative Example 1, and heat-pressed using a heat pressing machine at 100° C. and under a pressure of 150 kg/cm$^2$ for 30 seconds such that the tackiness preventive layer were in contact with a photosensitive resin to give a 2.8 mm thick photosensitive resin laminate (printing plate stock).

A woodfree paper was spray treated to make the water content thereof 0.1 g/m$^2$ and disposed on the cover film of the above-mentioned printing plate stock. A cushioning sheet was placed thereon, and the plate was housed in a corrugated fiberboard box, packaged and left standing for 2 days at room temperature.

Two days later, the printing plate stock was taken out, and the cover film was peeled off leaving the tackiness preventive layer on the photosensitive resin layer, followed by

TABLE 1

| | kind and content (wt %) of crystallizing agent *1) | | charged water-retention agent (wt %) *7) | water content (wt %) of tackiness preventive layer | | | | occurrence of wrinkles | | tacki-ness *4) | thickness of tackiness preventive layer ($\mu$m) |
|---|---|---|---|---|---|---|---|---|---|---|---|
| | | | | 24° C. 33% RH | 26° C. 42% RH | 28° C. 56% RH | 23° C. 71% RH | w/o deform *2) | w. deform *3) | | |
| Ex. 1 | 1,2-propylene glycol | 3.0 | 0.6 | 4.49 | 5.0 | 6.59 | 8.86 | none | none | none | 2.1 |
| Ex. 2 | 1,2-propylene glycol | 3.0 | 0.8 | 4.50 | 5.2 | 6.60 | 8.91 | none | none | none | 2.2 |
| Ex. 3 | 1,2-propylene glycol | 3.0 | 1.0 | 4.65 | 5.14 | 7.81 | 9.47 | none | none | none | 2.1 |
| Ex. 4 | 1,2-propylene glycol | 3.0 | 1.3 | 5.19 | 5.59 | 7.89 | 10.63 | none | none | none | 2.1 |
| Ex. 5 | ethylene glycol | 5.0 | 1.0 | 5.32 | 5.56 | 7.85 | 9.78 | none | none | none | 2.0 |
| Com. Ex. 1 | 1,2-propylene glycol | 3.0 | 0 | 2.76 | 3.41 | 3.89 | 6.73 | yes | yes | none | 1.9 |
| Com. Ex. 2 | — | 0 | 0 | 1.47 | 2.12 | 3.50 | 3.88 | yes | yes | none | 2.2 |
| Com. Ex. 3 | 1,2-propylene glycol | 3.0 | *5)0.6 | 3.5 | 4.0 | 27.0 | 50.0 | yes | yes | yes | 2.1 |
| Com. Ex. 4 | 1,2-propylene glycol | 3.0 | *6)10.0 | 1.7 | 3.0 | 12.0 | 40.0 | yes | yes | yes | 2.2 |

In Table 1, *1)–*5) represent the following.

*1): Content of crystallizing agent in tackiness preventive layer, as determined by gas chromatography analysis using GC-7A manufactured by SHIMADZU CORPORATION.

*2): In the case of plate without deformation.

*3): In the case of plate after bending.

*4): Tackiness between original drawing film and tackiness preventive layer

A negative film was placed on the tackiness preventive layer under the conditions of 24° C.·33% RH, 26° C.·42% RH, 28° C.·56% RH and 23° C.·71% RH. When the air was passed through therebetween under each condition, the tackiness was evaluated as "none", when the air was not passed through therebetween at least under one of the aforesaid conditions, the tackiness was evaluated as "yes".

*5): Glycerin was used as a water retention agent.

*6): Low molecular weight polyethylene glycol was used as a water retention agent.

*7): % by weight per solution.

observation of the surface. As a result, it showed smooth, mirror-like surface, and was free of wrinkles. The water content of the tackiness preventive layer then was 5.2 wt % under the conditions of 26° C.·56% RH.

Comparative Example 5

In the same manner as in Example 6 except that the woodfree paper was not disposed, a printing plate stock was packed and left standing at room temperature.

Two days later, the cover film was peeled off in the same manner as in Example 6 and the surface was observed. As a result, it showed human skin-like wrinkles. The water content of the tackiness preventive layer then was 3.8 wt % under the conditions of 26° C.·56% RH.

EXAMPLE 7

In the same manner as in Example 6 except that the woodfree paper was spray treated to make the water content 0.5 g/m$^2$, and the printing plate stock was packed and left standing at 50° C. for 2 days. Then, the cover film was peeled off leaving the tackiness preventive layer on the photosensitive resin layer, followed by observation of the surface. As a result, it showed smooth, mirror-like surface, and was free of wrinkles. The water content of the tackiness preventive layer then was 5.6 wt % under the conditions of 26° C.·56% RH.

Example 8

In the same manner as in Example 6 except that the woodfree paper was spray treated to make the water content 1.0 g/m², and the printing plate stock was packed and left standing at 50° C. for 2 days. Then, the cover film was peeled off leaving the tackiness preventive layer on the photosensitive resin layer, followed by observation of the surface. As a result, it showed smooth, mirror-like surface, and was free of wrinkles. The water content of the tackiness preventive layer then was 6.4 wt % under the conditions of 26° C.·56% RH.

EXAMPLE 9

In the same manner as in Example 6 except that the woodfree paper was spray treated to make the water content 2.0 g/m², and the printing plate stock was packed and left standing at 50° C. for 2 days. Then, the cover film was peeled off leaving the tackiness preventive layer on the photosensitive resin layer, followed by observation of the surface. As a result, it showed smooth, mirror-like surface, and was free of wrinkles. The water content of the tackiness preventive layer then was 7.1 wt % under the conditions of 26° C.·56% RH.

EXAMPLE 10

In the same manner as in Example 6 except that newspaper was used instead of the woodfree paper, which was spray treated to make the water content 1.0 g/m², and the printing plate stock was packed and left standing at 50° C. for 2 days. Then, the cover film was peeled off leaving the tackiness preventive layer on the photosensitive resin layer, followed by observation of the surface. As a result, it showed smooth, mirror-like surface, and was free of wrinkles. The water content of the tackiness preventive layer then was 12.5 wt % under the conditions of 26° C.·56% RH.

EXAMPLE 11

In the same manner as in Example 6 except that rough paper was used instead of the woodfree paper, which was spray treated to make the water content 1.0 g/m², and the printing plate stock was packed and left standing at 50° C. for 2 days. Then, the cover film was peeled off leaving the tackiness preventive layer on the photosensitive resin layer, followed by observation of the surface. As a result, it showed smooth, mirror-like surface, and was free of wrinkles. The water content of the tackiness preventive layer then was 6.8 wt % under the conditions of 26° C.·56% RH.

EXAMPLE 12

In the same manner as in Example 6 except that the cover film of the printing plate stock was spray treated to make the water content 5.0 g/m² on the cover film, and the printing plate stock was packed and left standing at 50° C. for 2 days. Then, the cover film was peeled off leaving the tackiness preventive layer on the photosensitive resin layer, followed by observation of the surface. As a result, it showed smooth, mirror-like surface, and was free of wrinkles. The water content of the tackiness preventive layer then was 5.3 wt % under the conditions of 26° C.·56% RH.

The results of Examples 6–12 and Comparative Example 5 are shown in Table 2.

TABLE 2

| | amount of water sprayed (g/m²) | kind of water-containing sheet | water content of tackiness preventive layer (wt %) | treatment of plate stock | occurrence of wrinkles |
|---|---|---|---|---|---|
| Ex. 6 | 0.1 | woodfree paper | 5.2 | room temp. 2 days | none |
| Ex. 7 | 0.5 | woodfree paper | 5.6 | 50° C., 2 days | none |
| Ex. 8 | 1.0 | woodfree paper | 6.4 | 50° C., 2 days | none |
| Ex. 9 | 2.0 | woodfree paper | 7.1 | 50° C., 2 days | none |
| Ex. 10 | 1.0 | newspaper | 12.5 | 50° C., 2 days | none |
| Ex. 11 | 1.0 | rough paper | 6.8 | 50° C., 2 days | none |
| Ex. 12 | 5.0 | direct spray | 5.3 | 50° C., 2 days | none |
| Comp. Ex. 5 | none | none | 3.8 | room temp. 2 days | yes |

As is evident from the foregoing description, the photosensitive resin laminate of the present invention includes a tackiness preventive layer which is free of occurrence of wrinkles under any environment during plate preparation, and thus, permits easy handling. Moreover, the laminate is superior in storage stability and can faithfully reproduce the images of the original drawing film, so that the inventive laminate greatly contributes to the benefit of the printing industry.

This application is based on application No. 190841/1996 filed in Japan, the content of which is incorporated hereinto by reference.

What is claimed is:

1. A photosensitive resin laminate comprising at least a support, a photosensitive resin layer, a tackiness preventive layer and a cover film in this order, said tackiness preventive layer having a water content of not less than 4 wt % under a relative humidity (RH) of 30%.

2. The photosensitive resin laminate of claim 1, wherein the tackiness preventive layer has a water content of 4–12 wt% under a relative humidity (RH) of 30%.

3. The photosensitive resin laminate of claim 1, wherein the tackiness preventive layer comprises a water retention agent.

4. The photosensitive resin laminate of claim 1, wherein the tackiness preventive layer comprises a water-soluble polymer, a water retention agent and a crystallizing agent.

5. A method for producing a photosensitive resin laminate comprising the step of laminating a support to a cover film comprising a tackiness prevention layer via a photosensitive resin layer, wherein said laminating comprises bringing said support and said tackiness prevention layer into contact with said photosensitive resin layer and wherein said tackiness prevention layer retains a moisture content of not less than 4 wt% under a relative humidity of 30% by the action of water present on the cover film.

6. The production method of claim 5, further comprising a water-containing sheet on the cover film.

7. A package comprising superimposed plural photosensitive resin laminates, each laminate comprising at least a support, a photosensitive resin layer, a tackiness preventive layer and a cover film in this order, and a water-containing sheet placed on each cover film.

* * * * *